(12) United States Patent
Sato

(10) Patent No.: US 10,844,482 B2
(45) Date of Patent: Nov. 24, 2020

(54) FILM FORMING APPARATUS

(71) Applicants: Kabushiki Kaisha Toshiba, Tokyo (JP); Toshiba Electronic Devices & Storage Corporation, Tokyo (JP)

(72) Inventor: Shinya Sato, Nonoichi Ishikawa (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 218 days.

(21) Appl. No.: 16/054,249

(22) Filed: Aug. 3, 2018

(65) Prior Publication Data

US 2019/0284688 A1    Sep. 19, 2019

(30) Foreign Application Priority Data

Mar. 16, 2018  (JP) ................. 2018-048682

(51) Int. Cl.
*C23C 16/40* (2006.01)
*C23C 16/44* (2006.01)
*C23C 16/455* (2006.01)

(52) U.S. Cl.
CPC ...... *C23C 16/4412* (2013.01); *C23C 16/4405* (2013.01); *C23C 16/4411* (2013.01); *C23C 16/45557* (2013.01)

(58) Field of Classification Search
CPC .... B01D 53/002; B01D 53/78; B01D 47/024; B01D 47/05; B01D 47/06; B01D 53/18; B01D 53/1456; B01D 45/08; B01D 2257/553; B01D 2257/2045; B01D 2258/0216; B01D 2257/55; B01D 2257/2047; C23C 16/24; C23C 16/4412;
(Continued)

(56) References Cited

U.S. PATENT DOCUMENTS

| 5,819,683 A | * | 10/1998 | Ikeda | ............... B01D 53/34 118/724 |
| 7,795,157 B2 | | 9/2010 | Terasaki et al. | |
| 2016/0348238 A1 | | 12/2016 | Nakata et al. | |

FOREIGN PATENT DOCUMENTS

| JP | 4759916 B2 | 8/2011 |
| JP | 4797068 B2 | 10/2011 |
| JP | 4914085 B2 | 4/2012 |

(Continued)

OTHER PUBLICATIONS

Machine Translation of JP2016-225411.*

*Primary Examiner* — Rudy Zervigon
(74) *Attorney, Agent, or Firm* — White & Case LLP

(57) ABSTRACT

A film forming apparatus according to an embodiment includes a reaction chamber; a pump; a storage container storing a discharged liquid; a first pipe having first and second end portions, the first end portion being connected to the reaction chamber, the first pipe extending in a first direction; a second pipe between the first pipe and the pump, having third and fourth end portions, extending in a second direction different from the first direction, the fourth end portion being connected to the pump; and a third pipe between the first pipe and the storage container, having fifth and sixth end portions, extending in a third direction different from the second direction, the fifth end portion being located on an imaginary straight line extending in the first direction from a center of the second end portion and the sixth end portion being connected to the storage container.

12 Claims, 17 Drawing Sheets

(58) Field of Classification Search
CPC ............. C23C 16/4411; C23C 16/4405; C23C 16/45557; C30B 29/06; C30B 25/14
USPC .................. 118/715; 156/345.33, 345.29
See application file for complete search history.

(56) References Cited

FOREIGN PATENT DOCUMENTS

| | | | | |
|---|---|---|---|---|
| JP | 2016-225411 | * | 5/2015 | ............. C23C 16/44 |
| JP | 2016-225411 A | | 12/2016 | |

* cited by examiner

FILM FORMING APPARATUS

This application is based upon and claims the benefit of priority from Japanese Patent Application No. 2018-048682, filed on Mar. 16, 2018, the entire contents of which are incorporated herein by reference.

FIELD

Embodiments described herein relate generally to a film forming apparatus.

BACKGROUND

In a film forming apparatus for manufacturing a semiconductor device or a liquid crystal device, a film is formed on a substrate by using reactive gas. Generally, the film deposition is performed by increasing a temperature of the substrate, flowing source gas for semiconductor into a reaction chamber, and adjusting a flow rate and a pressure of the reactive gas. Exhaust gas containing the reactive gas not consumed in the film formation, and reactive by-product gas generated by the decomposition reaction of the process gas is discharged from the reaction chamber to the outside of the film forming apparatus through an exhaust pipe, an exhaust pump, an exhaust gas treatment system, and the like.

The reactive by-products in the exhaust gas are cooled when the reactive by-products pass through the exhaust pipe from the reaction chamber, are condensed, and become droplets. However, the droplets cause clogging of the exhaust pipe or a failure of the exhaust pump. In addition, when the exhaust gas is detoxified by the exhaust gas treatment system, solid particles are produced as products and the exhaust pipe is clogged.

If the exhaust pipe is clogged or the exhaust pump fails, maintenance work of the film forming apparatus is required and an operating ratio of the film forming apparatus is lowered. Also, the liquid by-products originating from exhaust gas may contain harmful gas generating substances or ignitable substances and may be dangerous to the maintenance work.

DETAILED DESCRIPTION

Figure 1:
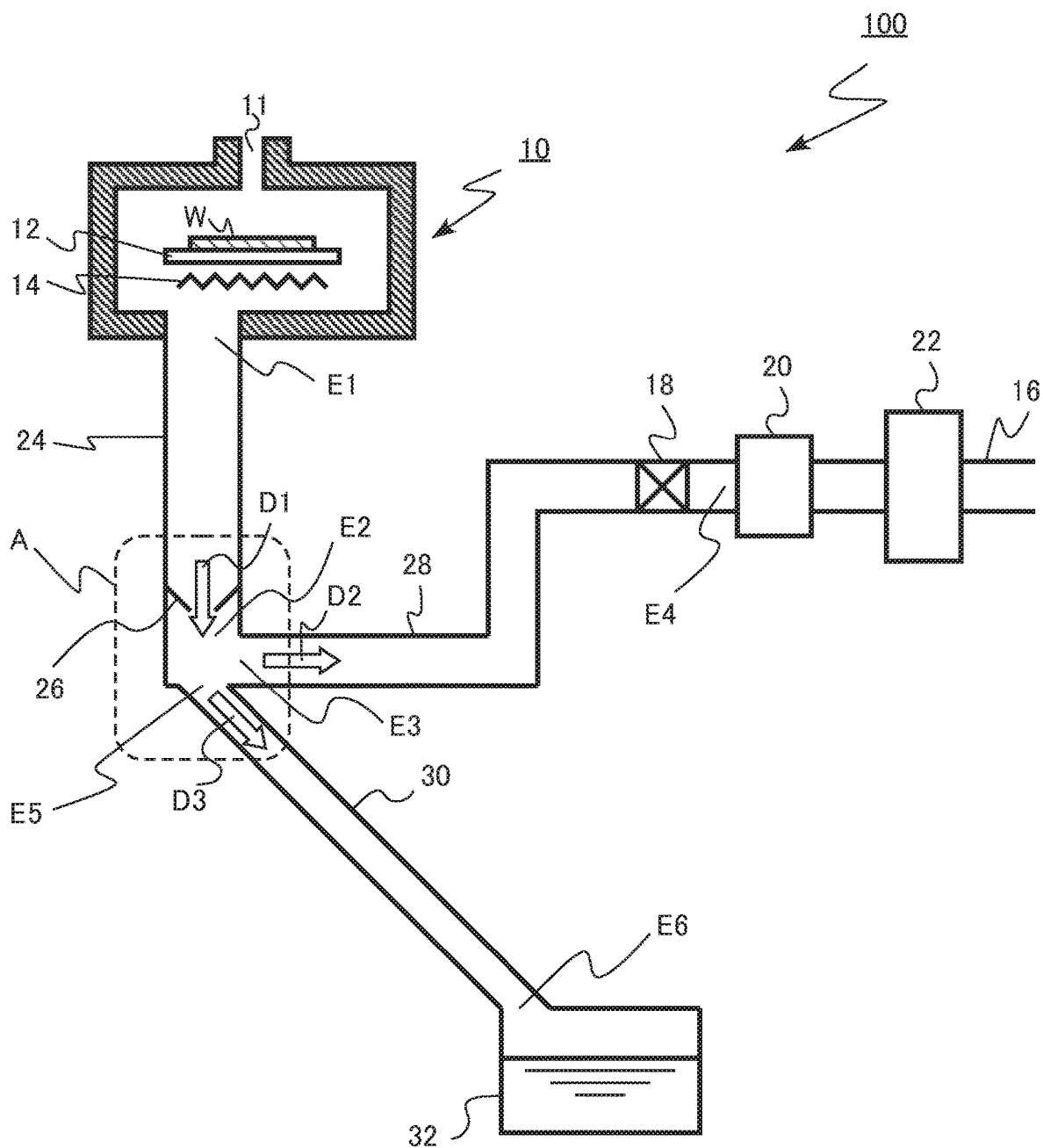
FIG. 1 is a schematic diagram of an example of a film forming apparatus according to a first embodiment.

Hereinafter, embodiments of the present disclosure will be described with reference to the drawings. In the following description, the same or similar parts are denoted by the same reference numerals and the description of the parts described once may be appropriately omitted.

First Embodiment

A film forming apparatus according to a first embodiment includes: a reaction chamber; a pump decompressing an inner portion of the reaction chamber; a storage container storing a discharged liquid; a first pipe having first end portion and second end portion, the first end portion being connected to the reaction chamber, the first pipe extending in a first direction in a vicinity of the second end portion, and the first pipe having a first opening area in cross-section perpendicular to the first direction; a second pipe provided between the first pipe and the pump, the second pipe having third end portion and fourth end portion, the second pipe extending in a second direction different from the first direction in the vicinity of the third end portion, the fourth end portion being connected to the pump; and a third pipe provided between the first pipe and the storage container, the third pipe having fifth end portion and sixth end portion, the third pipe extending in a third direction different from the second direction in the vicinity of the fifth end portion, the fifth end portion being located on an imaginary straight line extending in the first direction from a center of the second end portion and the sixth end portion being connected to the storage container.

FIG. 1 is a schematic diagram of an example of a film forming apparatus according to a first embodiment. The film forming apparatus according to the example of the first embodiment is a film forming apparatus 100 for manufacturing a semiconductor device. The film forming apparatus 100 according to the first embodiment is a single-wafer type film forming apparatus 100 for an epitaxial film formation.

Figure 2:
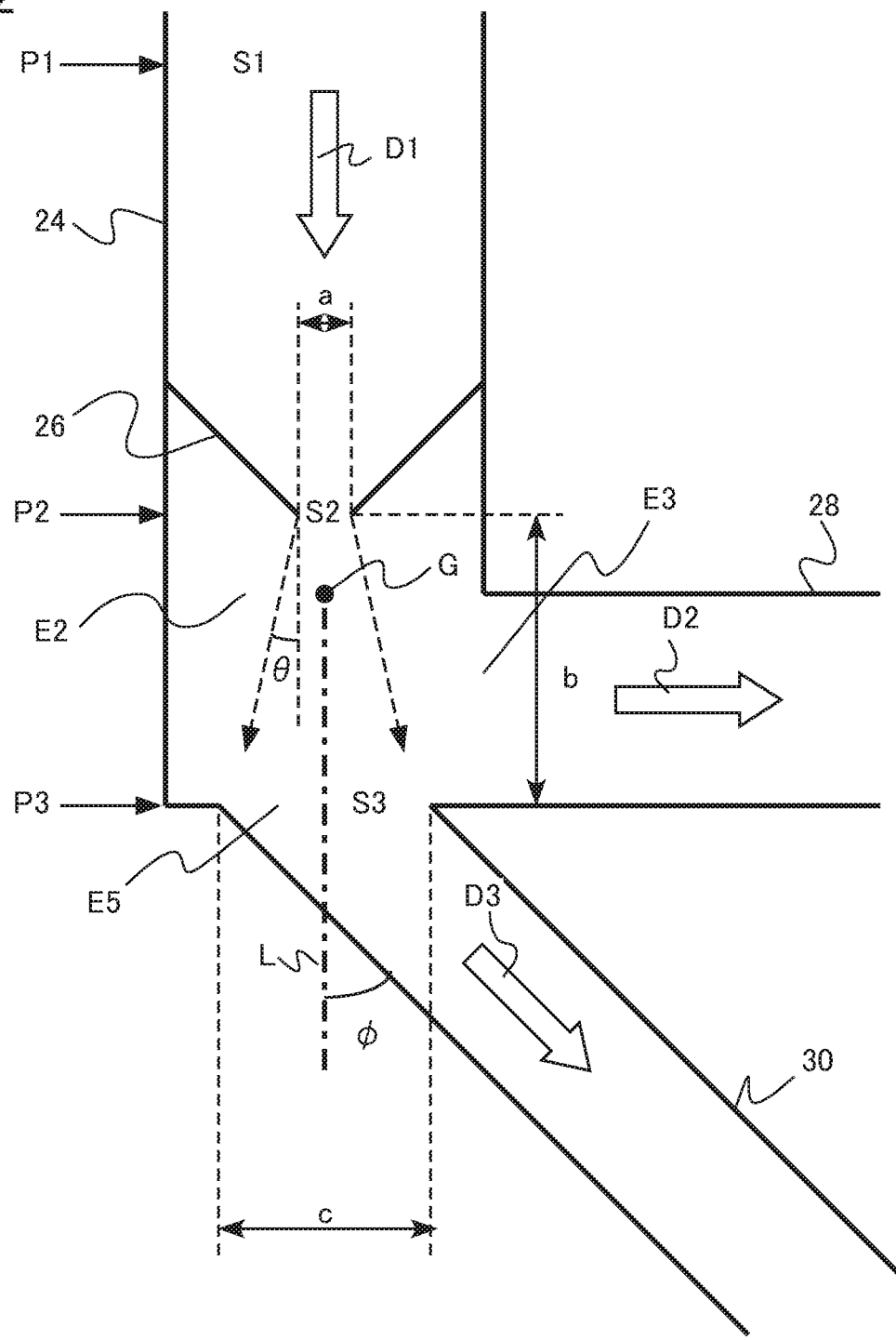
FIG. 2 is a partially enlarged view of the film forming apparatus according to the first embodiment.

FIG. 2 is a partially enlarged view of the film forming apparatus 100 according to the first embodiment. FIG. 2 is an enlarged view of a region surrounded by a dotted frame A in FIG. 1.

The film forming apparatus 100 includes a reaction chamber 10, a gas supply port 11, a stage 12, a heater 14, a discharge portion 16, a pressure adjustment valve 18, an exhaust pump 20 (pump), a exhaust gas treatment system 22, a first exhaust pipe 24 (first pipe), an orifice 26 (narrow portion), a second exhaust pipe 28 (second pipe), a drain 30 (third pipe), and a drainage tank 32 (storage container).

The reaction chamber 10 is provided with the stage 12 and the heater 14. A wafer W is disposed on the stage 12. The heater 14 heats the wafer W.

The gas supply port 11 is provided in an upper part of the reaction chamber 10. Raw material gas is supplied from the gas supply port 11 to the reaction chamber 10.

An inner portion of the reaction chamber 10 is decompressed to a desired pressure at the time of film formation. The exhaust gas containing the raw material gas not consumed in the reaction chamber 10, and reactive by-products generated by a reaction are discharged from the reaction chamber 10.

The first exhaust pipe 24 is provided between the reaction chamber 10 and the exhaust pump 20. The first exhaust pipe 24 is provided between the reaction chamber 10 and the drainage tank 32.

The first exhaust pipe 24 has a first end portion E1 and a second end portion E2. The first end portion E1 is connected to the reaction chamber 10.

The first exhaust pipe 24 extends in a first direction D1 at least in the vicinity of the second end portion E2. The first exhaust pipe 24 has a first opening area S1 in cross-section perpendicular to the first direction D1. For example, as shown in FIG. 2, the first exhaust pipe 24 has the first opening area S1 at a position P1 near the second end portion E2.

In the film forming apparatus 100, a movement direction of the exhaust gas in the first exhaust pipe 24 is matched with the first direction D1.

The exhaust gas discharged from the reaction chamber 10 passes through the first exhaust pipe 24. The exhaust gas contains the reactive by-products. A part of the reactive by-products in the exhaust gas is cooled and liquefied in the first exhaust, pipe 24 and becomes droplets.

The orifice 26 is an example of a narrow portion. The orifice 26 is provided in the first exhaust pipe 24. The orifice 26 has a second opening area S2 in a cross-section perpendicular to the first direction D1. As shown in FIG. 2, the orifice 26 has the second opening area S2 at a position P2.

The second opening area S2 is chosen such that the external gas flow rate decided from the kinetic energy of droplet in the gas is greater than external force such as the gravity and wind pressure. If the kinetic energy is smaller than the external force, it is determined that the second opening area S2 is smaller than the first opening area S1 for the purpose of increasing the gas velocity. For example, the second opening area S2 is 2.5% to 20% of the first opening area S1.

Because the opening area of the first exhaust pipe 24 is reduced at a portion of the orifice 26, the exhaust gas discharged from the reaction chamber 10 is accelerated by the orifice 26. The accelerated exhaust gas is ejected in the first direction D1 from the orifice 26.

The first exhaust pipe 24 branches into the second exhaust pipe 28 and the drain 30.

The second exhaust pipe 28 is provided between the first exhaust pipe 24 and the exhaust pump 20. The second exhaust pipe 28 has a third end portion P3 and a fourth end portion P4.

The second exhaust pipe 28 extends in a second direction D2 different from the first direction D1 at least in the vicinity of the third end portion E3. For example, an angle formed by the first direction D1 and the second direction D2 is 90 degrees. A fourth end portion P4 is connected to the exhaust pump 20.

The exhaust pump 20 is provided between the second exhaust pipe 28 and the discharge portion 16. The exhaust pump 20 has a function of decompressing the inner portion of the reaction chamber 10. The exhaust pump 20 is, for example, a vacuum pump.

The pressure adjustment valve 18 is provided between the second exhaust pipe 28 and the exhaust pump 20. An inner portion of the reaction chamber 10 can be adjusted to a desired pressure by using the pressure adjustment valve 18.

The exhaust gas treatment system 22 is provided between the exhaust pump 20 and the discharge portion 16. The exhaust gas treatment system 22 is, for example, a combustion type exhaust gas treatment system.

The exhaust gas treatment system 22 detoxifies the exhaust gas discharged from the reaction chamber 10. The detoxified exhaust gas is discharged from the discharge portion 16 to the outside of the film forming apparatus 100.

The drain 30 is provided between the first exhaust pipe 24 and the drainage tank 32. The drain 30 has a fifth end portion E5 and a sixth end portion E6.

The drain 30 extends in a third direction D3 different from the second direction D2 in the vicinity of the fifth end portion E5. The third direction D3 is also different from the first direction D1. The sixth end portion E6 is connected to the drainage tank 32.

An angle ($\phi$ in FIG. 2) formed by the first direction D1 and the third direction D3 is, for example, 0 degrees to 85 degrees.

The fifth end portion E5 is located on an imaginary straight line (L in FIG. 2) that virtually extends in the first direction D1 from a center (G in FIG. 2) of the second end portion E2. In other words, the fifth end portion E5 to be an entrance of the drain 30 is located on an extension line of the first exhaust pipe 24. A center $2r$ of the second end portion E2 is a geometric center of gravity of a cross-section of the second end portion E2 perpendicular to the first direction D1. For example, when the cross-section is circular, the center is a center of a circle.

The fifth end portion E5 has a third opening area S3. As shown in FIG. 2, the fifth end portion E5 has the third opening area S3 at a position 93. The third opening area S3 is an opening area of the drain 30 in a plane perpendicular to the first direction D1.

The third opening area S3 of the fifth end portion D5 is larger than the second opening area S2 of the orifice 26, for example. A diameter (c in FIG. 2) of the fifth end portion E5 is larger than a diameter (a in FIG. 2) of the orifice 26, for example.

When a distance between the orifice 26 and the fifth end portion E5 is b (refer to FIG. 2) and an ejection angle of the exhaust gas ejected from the orifice 26 is $\theta$ (refer to FIG. 2), for example, $c \geq a + 2b \cdot \tan \theta$ is satisfied. In addition, the diameter (c in FIG. 2) of the fifth end portion E5 is equal to or larger than twice the diameter (a in FIG. 2) of the orifice 26, for example.

At least a part of the drain 30 may be inclined with respect to the first direction D1. The drain 30 may be horizontal with respect to the direction of gravity in an entire area reaching from the fifth end portion E5 to the sixth end portion P6 or may be inclined in the direction of gravity toward the sixth end portion E6 from the fifth end portion P5. In other words, the drain 30 may not be inclined in a direction opposite to the direction of gravity toward the sixth end portion P6 from the fifth end portion E5.

A length of the drain 30 is, for example, 0.2 m to 10 m. In other words, the distance from the fifth end portion E5 to the sixth end portion E6 is, for example, 20 cm to 10 m.

The drain 30 has a function of capturing the droplets of the reactive by-products contained in the exhaust gas. The captured droplets (discharged liquid) of the reactive by-products are stored in the drainage tank 32 through the drain 30. The drain 30 is installed such that the discharged liquid flows through the drain 30 by gravity and is stored in the drainage tank 32.

The drainage tank 32 is an example of a storage container. The drainage tank 32 has a function of storing the discharged liquid originating from the reactive by-products.

In the drainage tank 32, the discharged liquid containing a component part of the exhaust gas is stored. The discharged liquid contains the droplets originating from the discharged exhaust gas. By removing the discharged liquid stored in the drainage tank 32, the discharged liquid containing a part of the exhaust gas is discharged from the film forming apparatus 100.

In the drainage tank 32, for example, there is no gas path connected to a portion other than the drain 30. In this case, the exhaust gas from which the droplets of the reactive by-products have been removed flows backward through the drain 30, flows to the second exhaust pipe 28, and is finally discharged from the discharge portion 16 to the outside of the film forming apparatus 100. In addition, in the drainage tank 32, for example, there may be a gas path connected to a portion other than the drain 30. Specifically, the gas path is connected to the second exhaust pipe 28. In this case, a gas passage in which gas flows to the second exhaust pipe 28 through the drain 30, the drainage tank 32, and the gas path is formed.

Next, functions and effects of the film forming apparatus 100 according to the first embodiment will be described.

In a general film forming apparatus, exhaust gas containing reactive by-products and raw material gas not used for film formation is discharged from the reaction chamber to the outside of the film forming apparatus through the exhaust pipe, the exhaust pump, the exhaust gas treatment system, and the like.

The reactive by-products in the exhaust gas are cooled when the reactive by-products pass through the exhaust pipe from the reaction chamber, are condensed, and become droplets. However, the droplets cause clogging of the exhaust pipe or a failure of the exhaust pump. In addition, when the exhaust gas is introduced to the exhaust gas treatment system, the decomposing materials are deposited as solidified products on an inside surface of the exhaust pipe of the exhaust gas treatment system and it result in obstruction of the exhaust pipe.

If the exhaust pipe is clogged or the exhaust pump fails, maintenance work of the film forming apparatus is required and an operating ratio of the film forming apparatus is lowered. Also, the droplets originating from exhaust gas may contain harmful gas generating substances or ignitable substances and may be dangerous to the maintenance work. For this reason, it is desired to suppress clogging of the exhaust pipe or a failure of the exhaust pump due to the droplets originating from the exhaust gas.

Specifically, for example, when an epitaxial film of silicon is formed, gas of chlorosilane polymers ($Si_xH_yCl_z$: x is 2 or more) or chlorosilanes such as trichlorosilane ($SiHCl_3$), tetrachlorosilane ($SiCl_4$), tetrachlorodsdiane ($Si_2H_2Cl_4$), hexachlorodisilane ($Si_2Cl_6$), and octachlorotrisilane ($Si_3Cl_8$) is generated as the reactive by-products. The exhaust gas from the reaction chamber contains the gas of the reactive by-products.

If the exhaust gas is discharged to the outside the reaction chamber, the exhaust gas is cooled and the gas of the reactive by-products is condensed, is liquefied, and forms the droplets. The droplets cause clogging of the exhaust pipe or a failure of the exhaust pump.

Figure 3:
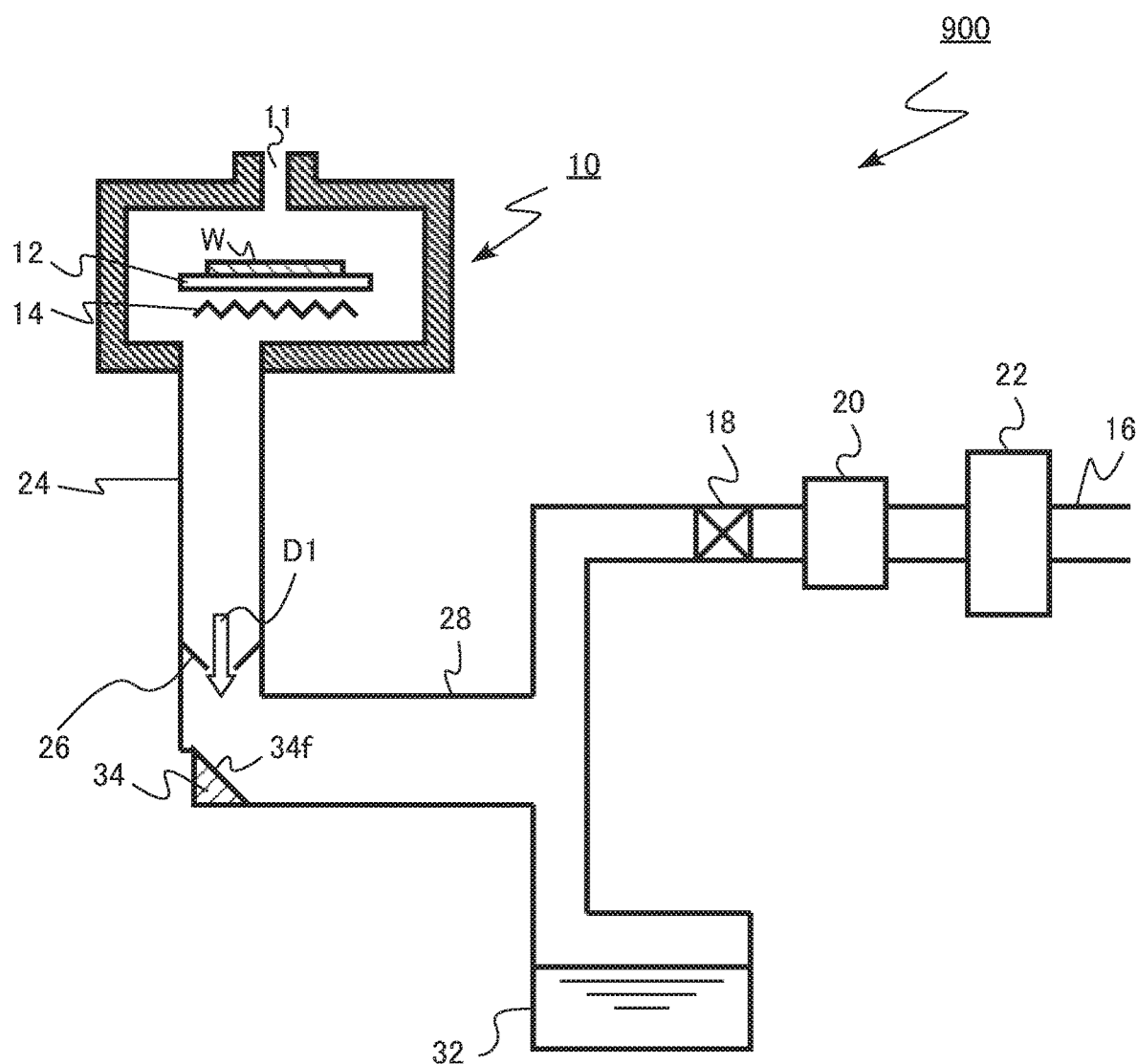
FIG. 3 is a schematic diagram of a film forming apparatus according to a comparative example.

FIG. 3 is a schematic diagram of a film forming apparatus according to a comparative example. The film forming apparatus according to the comparative example is a film forming apparatus 900 for manufacturing a semiconductor device. The film forming apparatus 900 according to the comparative example is a single-wafer type film forming apparatus 900 for an epitaxial film formation.

The film forming apparatus 900 according to the comparative example is different from the film forming apparatus 100 according to the first embodiment in that a capturing portion 34 is provided instead of the drain 30. The capturing portion 34 includes an inclined surface 34f.

The film forming apparatus 900 according to the comparative example causes the droplets of the reactive by-products injected and accelerated from the orifice 26 to collide with the inclined surface 34f of the capturing portion 34. As a result, it is possible to intensively capture the droplets and efficiently collect the droplets of the reactive by-products. The droplets captured by the capturing portion 34 flow to the drainage tank 32 along the inclined surface 34f and are stored.

However, when a velocity of the droplets is high and kinetic energy of the droplets is large, the droplets bounce off the inclined surface 34f, so that collection efficiency of the droplets may be lowered. In addition, in the film forming apparatus 900, a flow of gas in a direction opposite to an injection direction from the orifice 26 is generated by the exhaust gas reflected by the inclined surface 34f. The droplets are pushed back by a wind pressure generated by the flow of the gas in the opposite direction and the collection efficiency of the droplets may be lowered.

Figure 4:
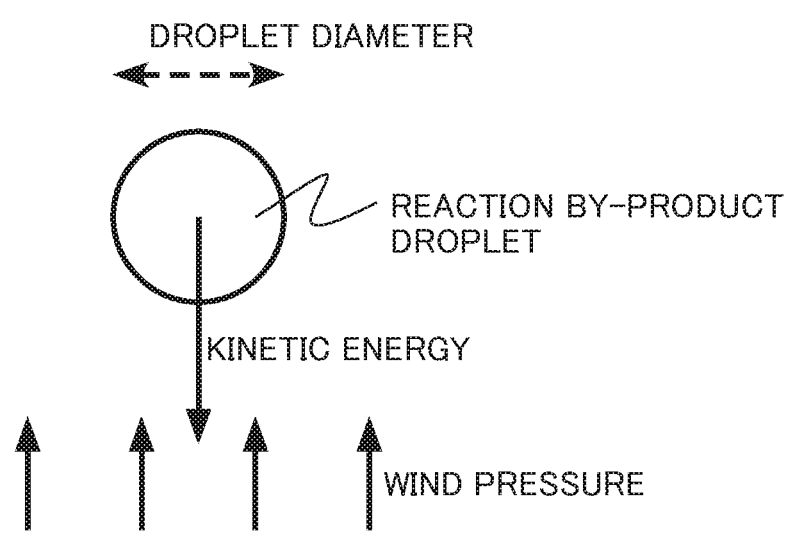
FIG. 4 is an explanatory view of a relation between kinetic energy of droplets and a wind pressure.

FIGS. 4, 5A, 5B, 5C, and 5D are explanatory diagrams of a relation between the kinetic energy of the droplets and the wind pressure. FIG. 4 is a schematic diagram and FIGS. 5A, 5B, 5C, and 5D are graphs showing a relation between the kinetic energy of the droplets and the wind pressure.

Figure 5B:
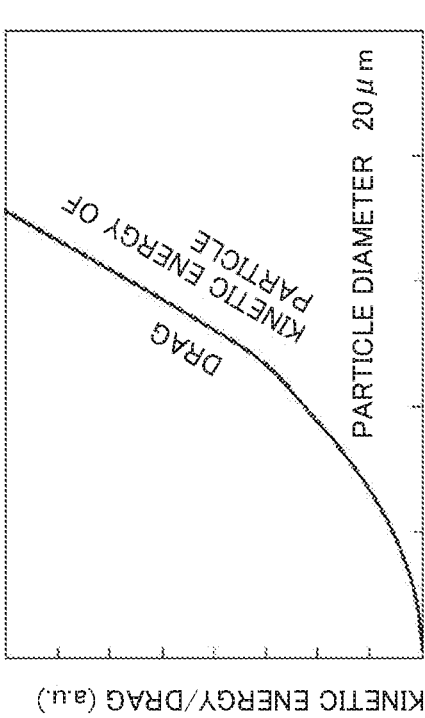
FIGS. 5A, 5B, 5C, and 5D are explanatory diagrams of a relation between kinetic energy of droplets and a wind pressure.
Figure 5D:
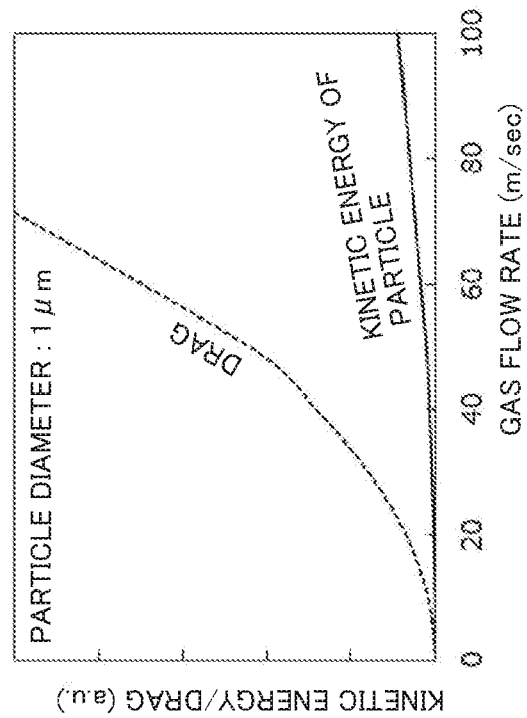
Figure 5A:
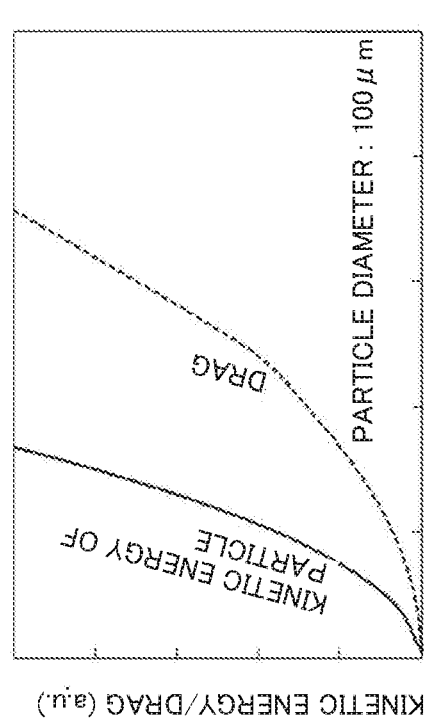
Figure 5C:
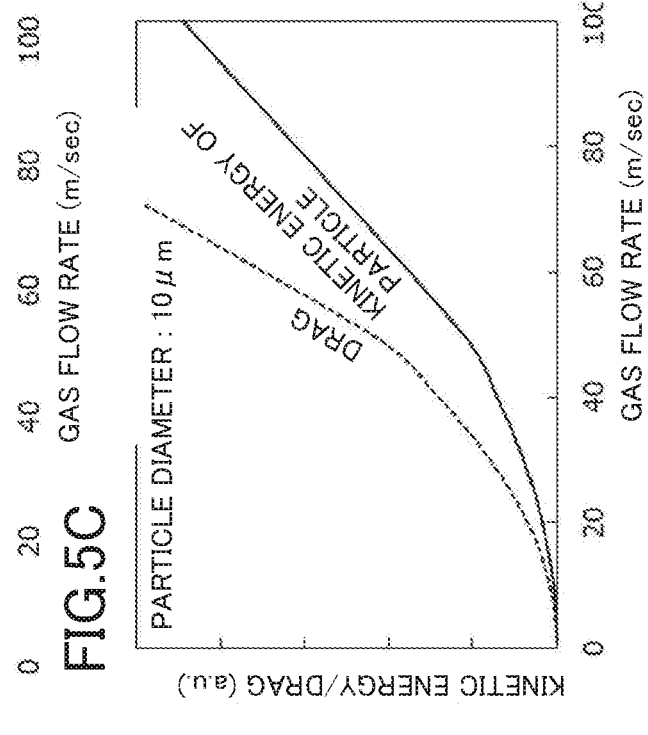

As shown in FIG. 4, if a wind pressure (drag) of gas in a direction opposite to a movement direction of the droplets exceeds the kinetic energy of the droplets of the reactive by-products, the droplets are pushed back. When a pressure is 10 kPa, a pipe temperature is 300 K, and a density ($\rho$) of mixed gas is 0.03 kg/m³ as a representative example, calculated results of the kinetic energy of the droplets and the wind pressure (drag) with respect to the gas flow rate are shown in FIGS. 5A, 5B, 5C, and 5D. FIG. 5A shows the case where a diameter of the flying droplet is 100 μm, FIG. 5B shows the case where the diameter is 20 μm, FIG. 5C shows the case where the diameter is 10 μm, and FIG. 5D shows the case where the diameter is 1 μm.

For example, when the droplet diameter is smaller than 20 μm, the drag in the direction opposite to the movement direction of the droplet exceeds the kinetic energy of the droplet. For example, in the case of epitaxial growth of silicon, the droplet diameter in the exhaust gas varies depending on film formation conditions, the distance from the reaction chamber, or an environmental temperature. However, it is assumed that the droplet diameter is approximately 20 μm or less. Therefore, it can be said that the collection efficiency of the droplets may be lowered by the exhaust gas reflected by the inclined surface 34f.

Figure 6:
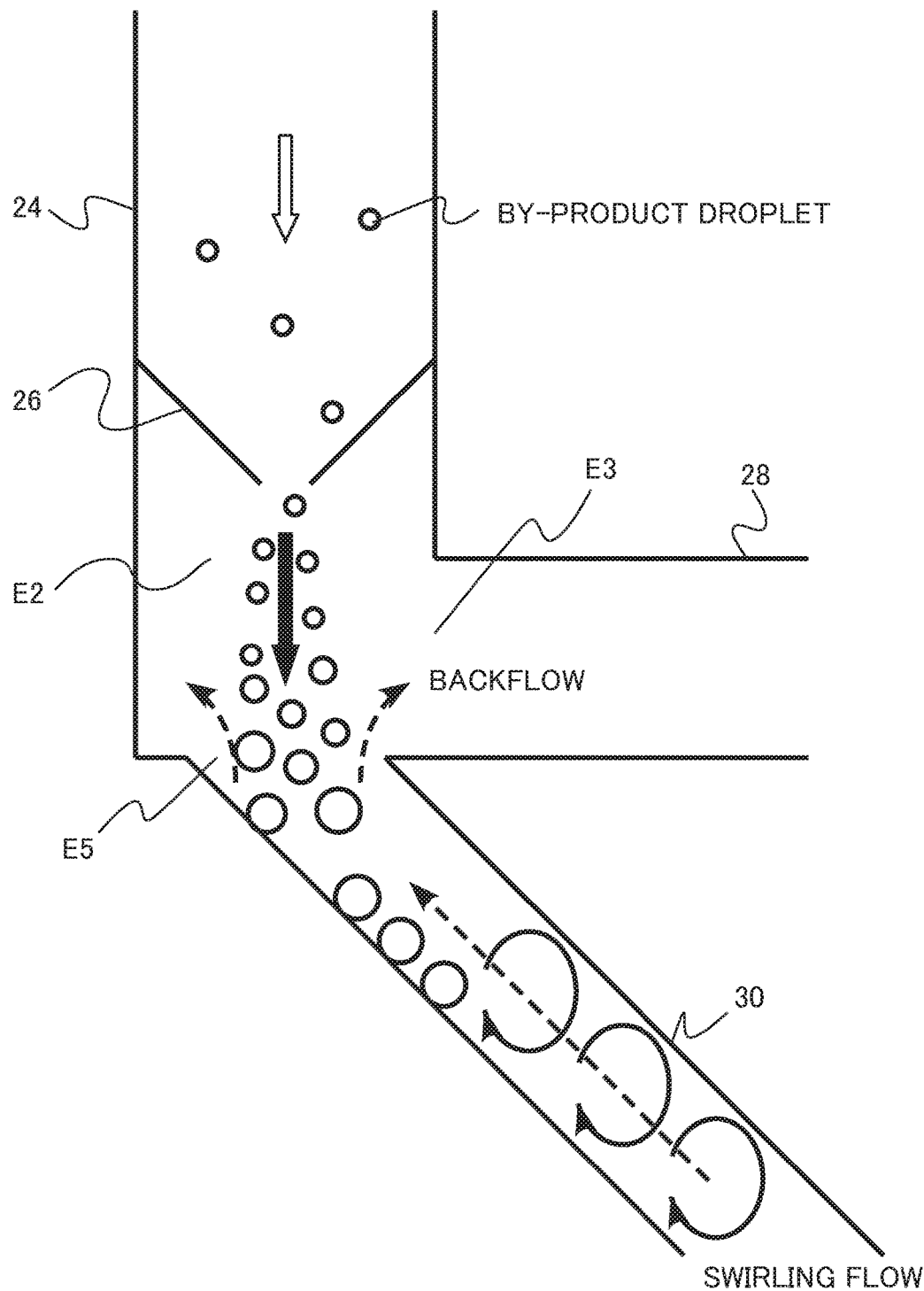
FIG. 6 is an explanatory view of functions and effects according to the first embodiment.

FIG. 6 is an explanatory view of functions and effects according to the first embodiment. FIG. 6 schematically shows a flow of the exhaust gas in the film forming apparatus 100.

In the film forming apparatus 100 according to the first embodiment, the exhaust gas elected from the orifice 26 in the first direction D1 directly flows to the drain 30 existing right under the orifice 26. The droplets of the reactive by-products in the exhaust gas collide with a wall surface of the drain 30 or collide with each other, so that the kinetic energy is lost. In the droplets that have lost the kinetic energy, sizes of the droplets in which the droplets are collected increase and the droplets adhere to the wall surface of the drain 30. The droplets flow along the wall surface of the drain 30 and are stored as the discharged liquid in the drainage tank 32.

In the film forming apparatus 100 according to the first embodiment, even if the droplets bounce off the wall surface of the drain 30, the probability of colliding with the wall surface of the drain 30 again increases. Therefore, the collection efficiency of the droplets is suppressed from being lowered by bouncing of the droplets.

In addition, the exhaust gas flows through the drain 30 having the predetermined length, so that the wind pressure of the exhaust gas flowing backward through the drain 30 is suppressed. Therefore, the collection efficiency of the droplets is suppressed from being lowered by the exhaust gas flowing backward through the drain 30.

Furthermore, the third direction D3 of the drain 30 is inclined with respect to the first direction D1 to be the election direction of the exhaust gas, so that a swirling flow is likely to occur in the drain 30. The exhaust gas is likely to be drawn into the drain 30 by the swirling flow occurring in the drain 30. Therefore, the wind pressure of the exhaust gas flowing backward through the drain 30 is suppressed and the collection efficiency of droplets is suppressed from being lowered.

By the swirling flow in the drain 30, the droplets in the exhaust gas are likely to be centrifugally separated and to adhere to an inner wall of the drain 30. Therefore, the collection efficiency of the droplets is improved.

Figure 7:
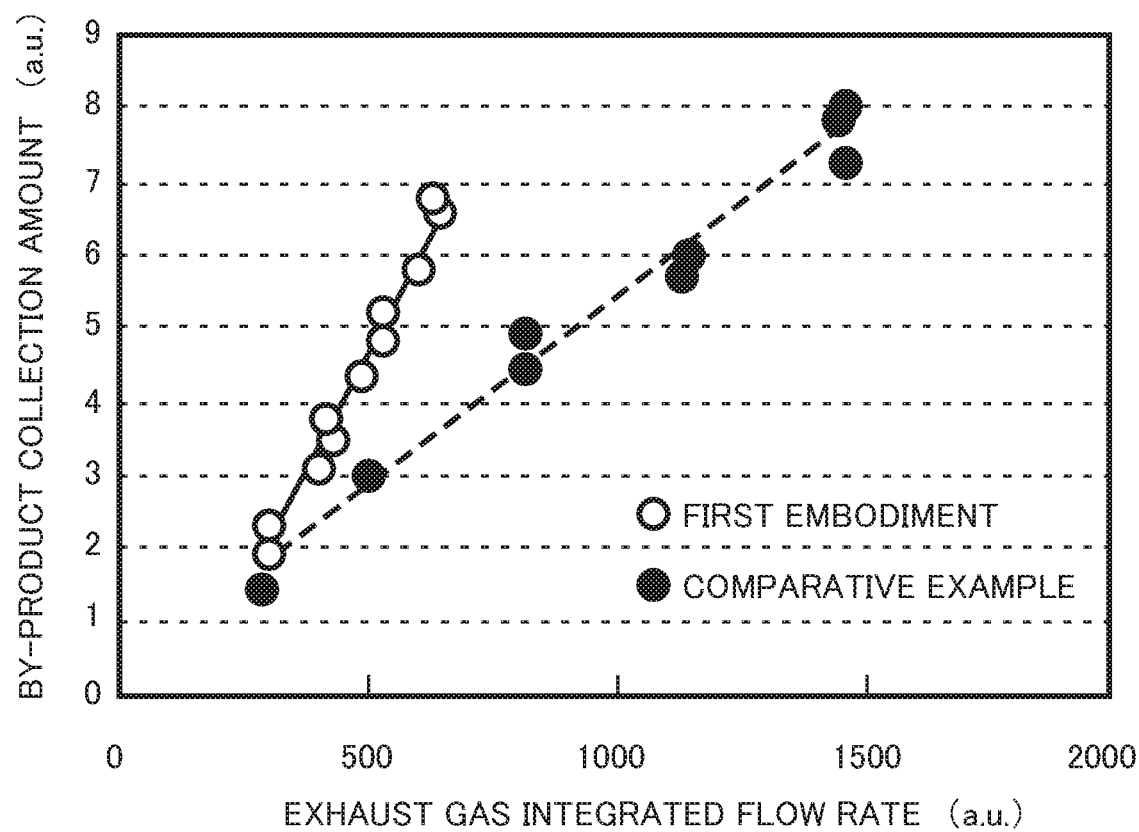
FIG. 7 is an explanatory diagram of functions and effects according to the first embodiment.

FIG. 7 is an explanatory diagram of functions and effects according to the first embodiment. FIG. 7 shows comparison of by-product collection amounts between the film forming apparatus 100 according to the first embodiment and the film forming apparatus 900 according to the comparative example. A horizontal axis represents an exhaust gas integrated flow rate and a vertical axis represents a by-product collection amount.

As apparent from FIG. 7, in the film forming apparatus 100 according to the first embodiment, the by-product collection amount is larger than that in the film forming apparatus 900 according to the comparative example. Particularly, if the exhaust gas integrated flow rate increases, the by-product collection amount is about twice. It is considered that the collection efficiency of the droplets is suppressed from being lowered by bouncing of the droplets or the backflow of the exhaust gas, in the film forming apparatus 100.

In the film forming apparatus 100, it is preferable to provide the orifice 26 from the viewpoint of efficiently guiding the exhaust gas flowing through the first exhaust pipe 24 to the drain 30. However, for example, if a straightly advancing property of the exhaust gas is sufficiently obtained by the first exhaust pipe 24, a configuration in which the orifice 26 is omitted can be realized.

In the case of providing the orifice 26, the third opening area S3 of the fifth end portion E5 is preferably larger than the second opening area S2 of the orifice 26. In addition, the diameter (c in FIG. 2) of the fifth end portion E5 is preferably larger than the diameter (a in FIG. 2) of the orifice 26. By the above configuration, the exhaust gas elected from the orifice 26 can be efficiently guided to the drain 30.

At least a part of the drain 30 is preferably inclined with respect to the first direction D1. Particularly, the drain 30 is preferably inclined with respect to the first direction D1 in the vicinity of the fifth end portion E5. That is, particularly, the third direction D3 is preferably different from the first direction D1. By the above configuration, the swirling flow is likely to occur in the drain 30.

The drain 30 is preferably horizontal with respect to the direction of gravity in an entire area reaching from the fifth end portion P5 to the sixth end portion E6 or is preferably inclined with respect to the direction of gravity toward the sixth end portion P6 from the fifth end portion P5. By the above configuration, the droplets adhering to the inside of the drain 30 are likely to flow to the drainage tank 32.

The length of the drain 30 is preferably, for example, 0.2 m to 10 m, and is more preferably 0.5 m to 2 m. If the length is below the above range, the wind pressure of the exhaust gas flowing backward through the drain 30 may increase. In addition, if the length is above the above range, maintenance may become difficult.

As described above, according to the first embodiment, the collection efficiency of the droplets of the reactive by-products contained in the exhaust gas is improved. Therefore, it is possible to provide a film forming apparatus capable of suppressing clogging of the exhaust pipe or a failure of the exhaust pump.

Second Embodiment

A film forming apparatus according to a second embodiment is different from the film forming apparatus according to the first embodiment in that a first direction and a third direction are the same. Hereinafter, description of contents overlapping with those of the first embodiment will be partially omitted.

Figure 8:
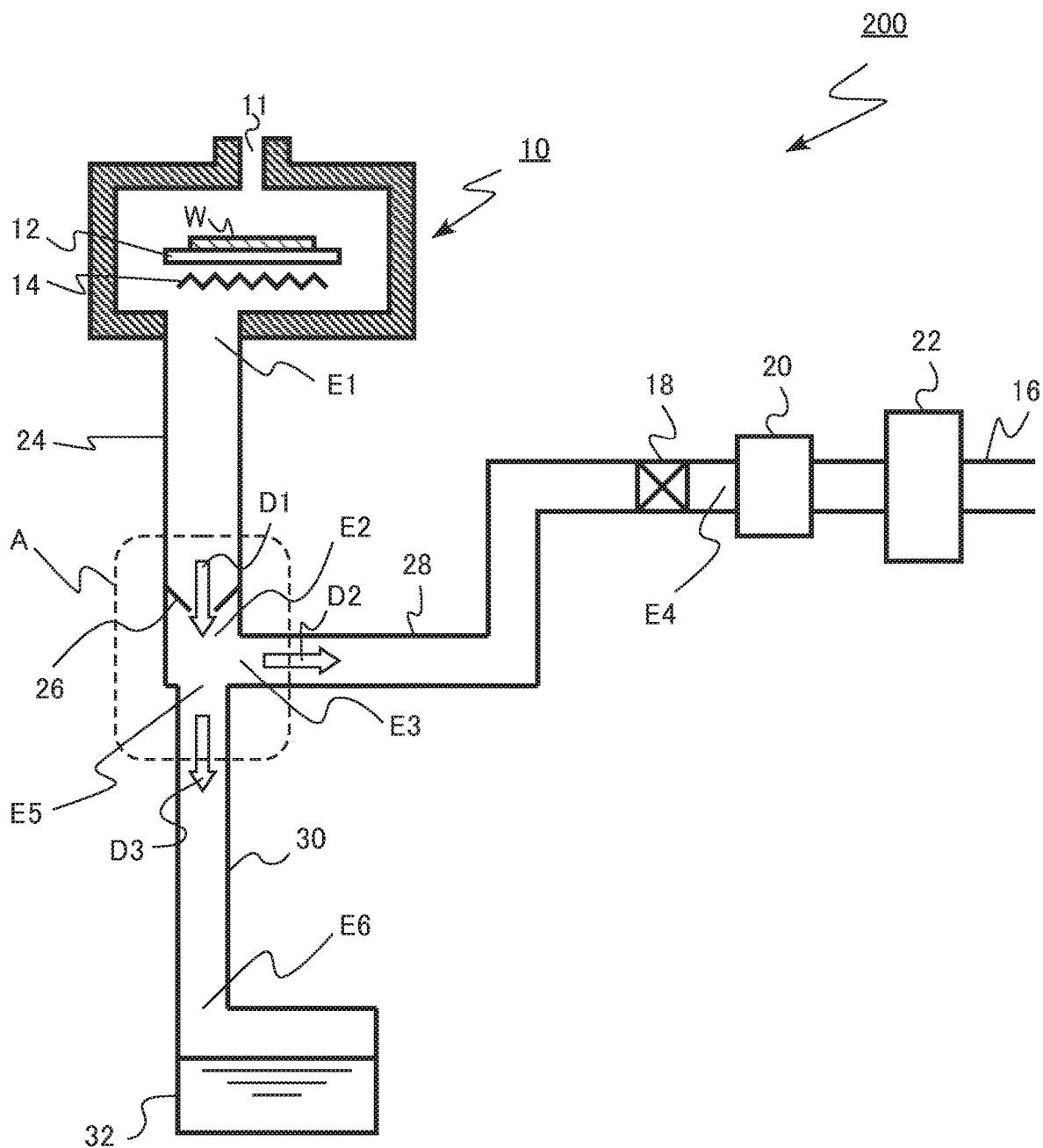
FIG. 8 is a schematic diagram of an example of a film forming apparatus according to a second embodiment.

FIG. 8 is a schematic diagram of an example of the film forming apparatus according to the second embodiment. The film forming apparatus according to the example of the second embodiment is a film forming apparatus 200 for manufacturing a semiconductor device. The film forming apparatus 200 according to the second embodiment is a single-wafer type film forming apparatus 200 for an epitaxial film formation.

Figure 9:
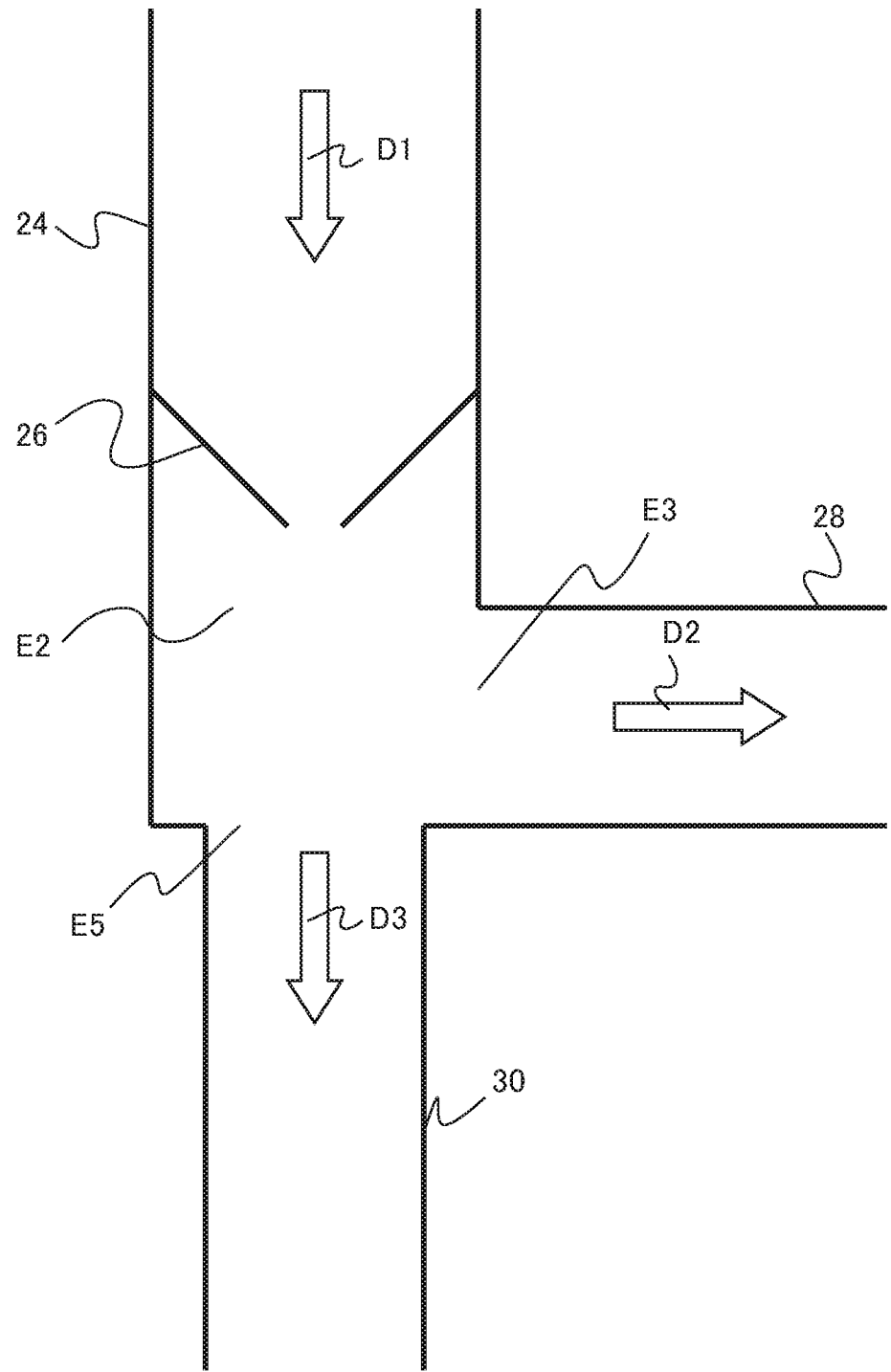
FIG. 9 is a partially enlarged view of the film forming apparatus according to the second embodiment.

FIG. 9 is a partially enlarged view of the film forming apparatus 200 according to the second embodiment. FIG. 9 is an enlarged view of a region surrounded by a dotted frame A in FIG. 8.

A first exhaust pipe 24 extends in a first direction D1 in the vicinity of at least a second end portion E2. A drain 30 extends in a third direction D3 in the vicinity of a fifth end portion E5.

The first direction D1 and the third direction D3 are the same. In other words, the first exhaust pipe 24 and the drain 30 are on the same straight line.

Similarly to the film forming apparatus 100 according to the first embodiment, in the film forming apparatus 200 according to the second embodiment, exhaust gas elected from an orifice 26 in the first direction D1 directly flows to the drain 30 existing right under the orifice 26. Droplets of reactive by-products in the exhaust gas collide with a wall surface of the drain 30 or collide with each other, so that kinetic energy is lost. In the droplets that have lost the kinetic energy, sizes of the droplets in which the droplets are collected increase, the droplets flow along the wall surface of the drain 30, and the droplets are stored as a discharged liquid in a drainage tank 32.

In the film forming apparatus 200 according to the second embodiment, because the first direction D1 and the third direction D3 are the same, bouncing of the droplets on the wall surface of the drain 30 and returning to a second exhaust pipe 28 are further suppressed.

As described above, according to the second embodiment, collection efficiency of the droplets of the reactive by-products contained in the exhaust gas is improved. Therefore, it is possible to provide a film forming apparatus capable of suppressing clogging of an exhaust pipe or a failure of an exhaust pump.

Third Embodiment

A film forming apparatus according to a third embodiment is different from the film forming apparatus according to the second embodiment in that a cooling portion to cool a third pipe is further provided. Hereinafter, description of contents overlapping with those of the second embodiment will be partially omitted.

Figure 10:
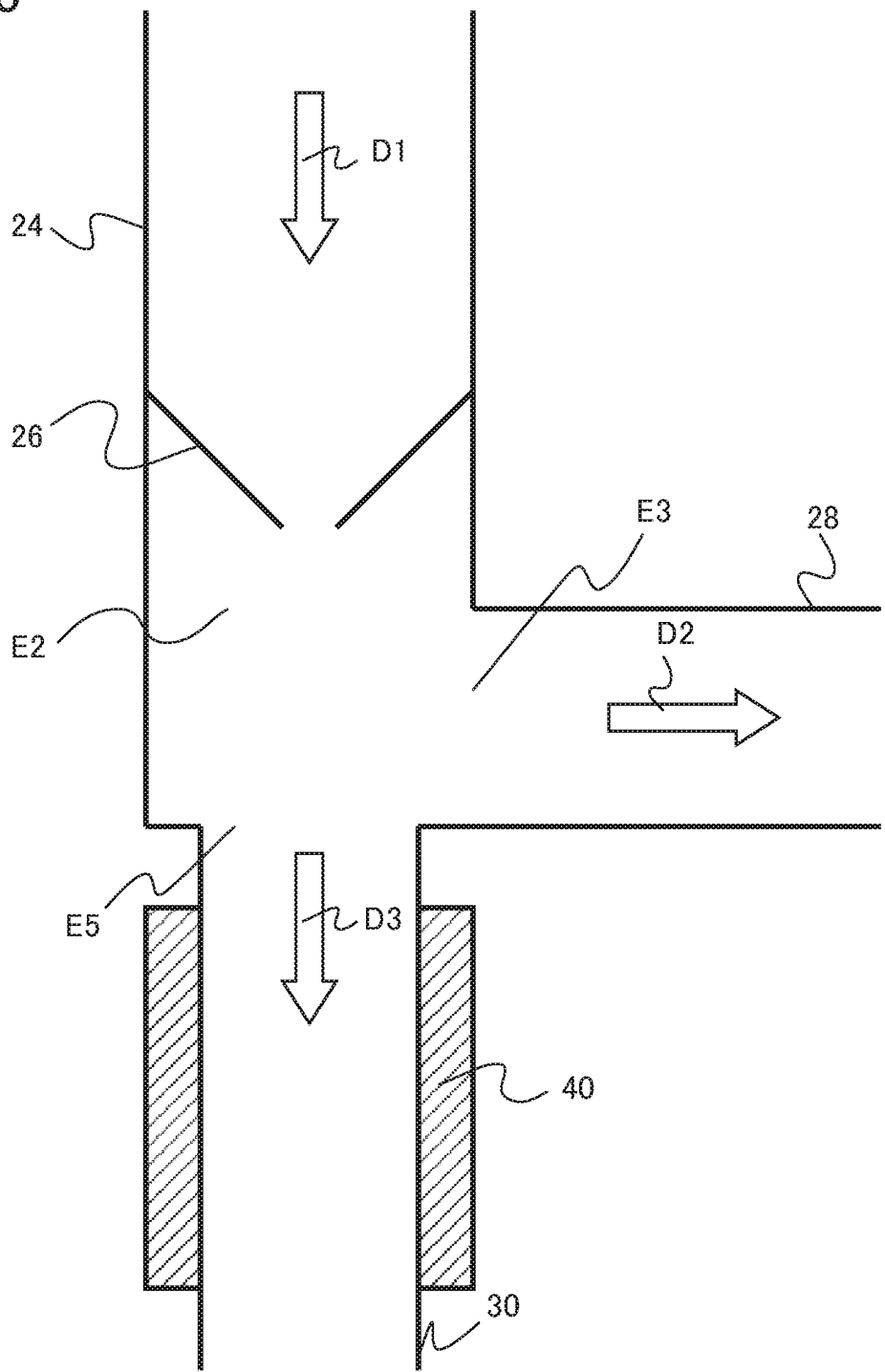
FIG. 10 is a schematic diagram of an example of a film forming apparatus according to a third embodiment.

FIG. 10 is a partially enlarged view of the film forming apparatus according to the third embodiment. FIG. 10 is a diagram corresponding to FIG. 9 showing the second embodiment.

The film forming apparatus according to the third embodiment includes a cooling portion 40 to cool a drain 30. The cooling portion 40 is, for example, a water cooling pipe. The cooling portion 40 has a function of cooling exhaust gas in the drain 30.

In the film forming apparatus according to the third embodiment, liquefaction of the exhaust gas and growth of the droplets are promoted by cooling the exhaust gas. Therefore, collection efficiency of the droplets of the reactive by-products contained in the exhaust gas is further improved.

As described above, according to the third embodiment, the collection efficiency of the droplets of the reactive by-products contained in the exhaust gas is further improved as compared with the second embodiment. Therefore, it is possible to provide a film forming apparatus capable of suppressing clogging of an exhaust pipe or a failure of an exhaust pump.

Fourth Embodiment

A film forming apparatus according to a fourth embodiment is different from the film forming apparatus according to the second embodiment in that the film forming apparatus further including a spiral-shaped part provided in the third pipe extending in the third direction. Hereinafter, description of contents overlapping with those of the second embodiment will be partially omitted.

Figure 11:
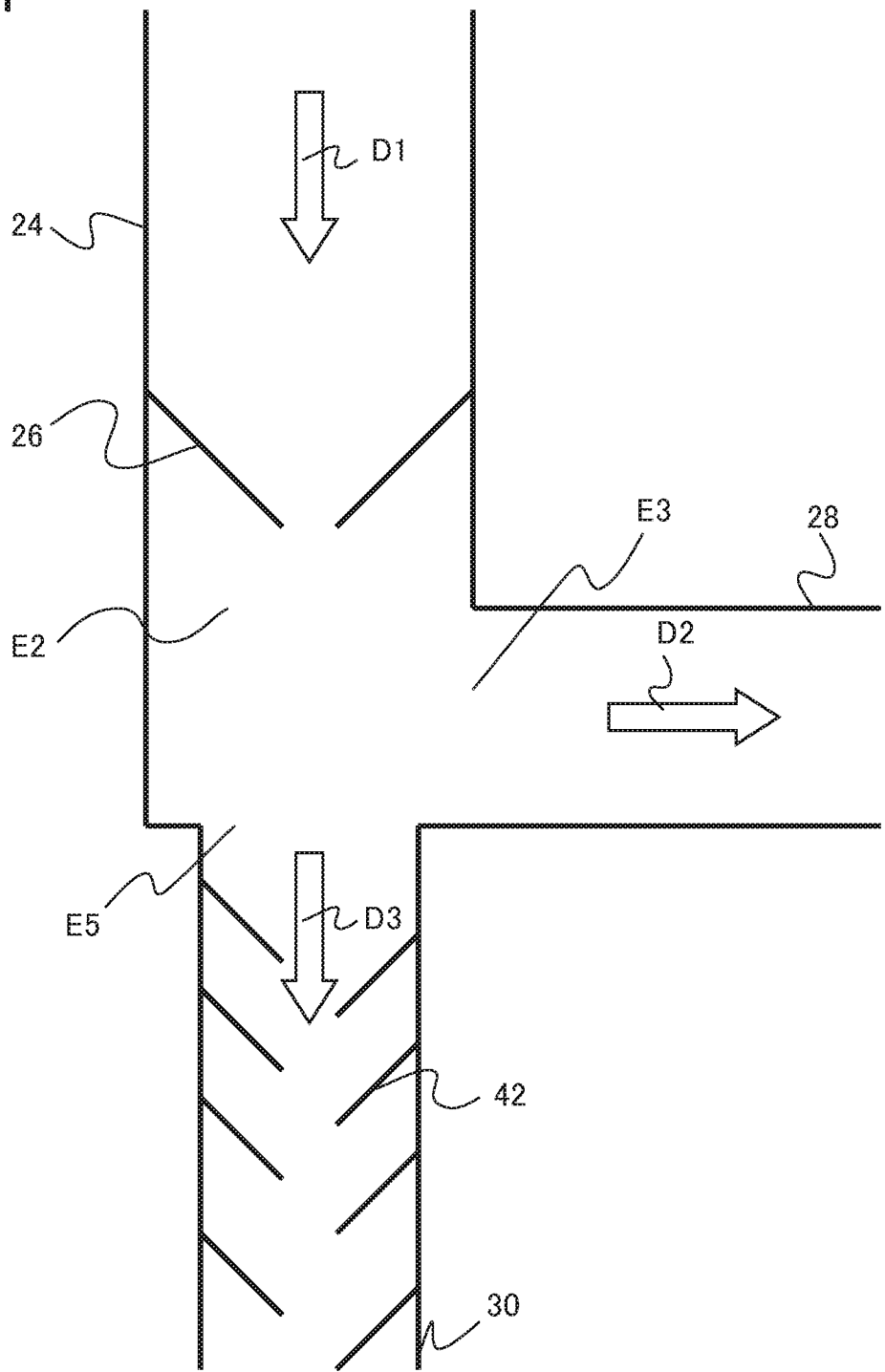
FIG. 11 is a schematic diagram of an example of a film forming apparatus according to a fourth embodiment.

FIG. 11 is a partially enlarged view of the film forming apparatus according to the fourth embodiment. FIG. 11 is a diagram corresponding to FIG. 9 showing the second embodiment.

The film forming apparatus according to the fourth embodiment has a spiral-shaped part 42 provided in a drain 30. The spiral-shaped part 42 extends in the third direction D3.

In the film forming apparatus according to the fourth embodiment, the spiral-shaped part 42 is provided, so that a swirling flow is likely to occur in the drain 30. For this reason, exhaust gas is likely to be drawn into the drain 30 by the swirling flow occurring in the drain 30. Therefore, a wind pressure of the exhaust gas flowing backward through the drain 30 is suppressed. Therefore, collection efficiency of the droplets is suppressed from being lowered by backflow of the exhaust gas. By the swirling flow, the droplets in the exhaust gas are likely to be centrifugally separated and to adhere to an inner wall of the drain 30. Therefore, the collection efficiency of the droplets is improved.

As described above, according to the fourth embodiment, the collection efficiency of the droplets of the reactive by-products contained in the exhaust gas is further improved as compared with the second embodiment. Therefore, it is possible to provide a film forming apparatus capable of suppressing clogging of an exhaust pipe or a failure of an exhaust pump. In the fourth embodiment, for example, even if a flexible pipe having a spiral shape is used instead, the same effects are obtained.

Fifth Embodiment

A film forming apparatus according to a fifth embodiment is different from the film forming apparatus according to the second embodiment in that the film forming apparatus further includes funnel-shaped parts provided in the third pipe. Hereinafter, description of contents overlapping with those of the second embodiment will be partially omitted.

Figure 12:
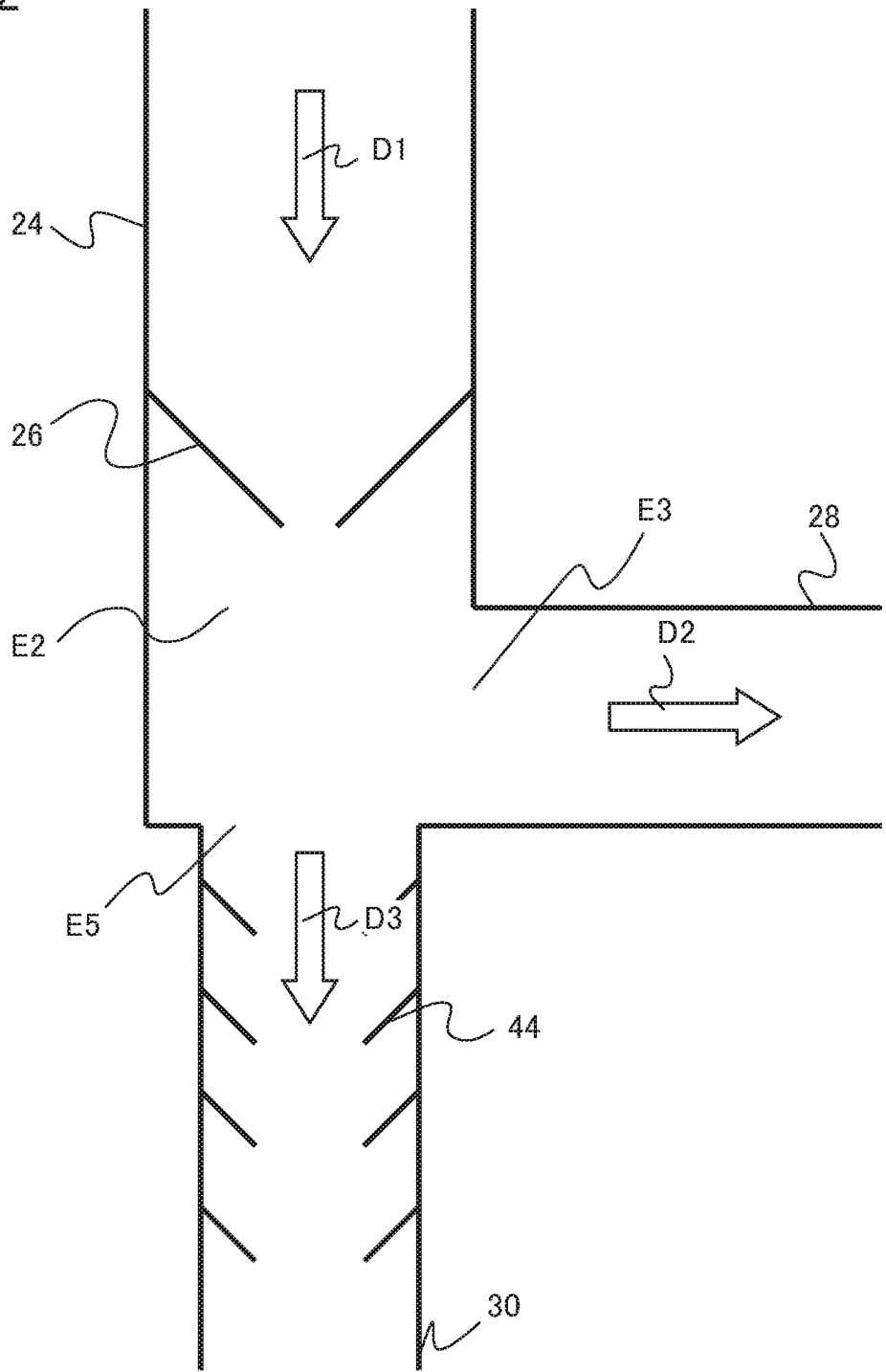
FIG. 12 is a schematic diagram of an example of a film forming apparatus according to a fifth embodiment.

FIG. 12 is a partially enlarged view of the film forming apparatus according to the fifth embodiment. FIG. 12 is a diagram corresponding to FIG. 9 showing the second embodiment.

The film forming apparatus according to the fifth embodiment has a plurality of funnel-shaped parts 44 provided in a drain 30. The funnel-shaped parts 44 are disposed in an extension direction of the drain 30 on an inner wall of the drain 30.

In the film forming apparatus according to the fifth embodiment, the funnel-shaped parts 44 are provided, so that an area of a droplet contact portion increases in the drain 30. Therefore, collection efficiency of the droplets is improved.

In addition, a wind pressure of exhaust gas flowing backward through the drain 30 is suppressed and the collection efficiency of the droplets is suppressed from being lowered by the wind pressure.

As described above, according to the fifth embodiment, the collection efficiency of the droplets of the reactive by-products contained in the exhaust gas is further improved as compared with the second embodiment. Therefore, it is possible to provide a film forming apparatus capable of suppressing clogging of an exhaust pipe or a failure of an exhaust pump.

Sixth Embodiment

A film forming apparatus according to a sixth embodiment is different from the film forming apparatus according to the second embodiment in that the film forming apparatus further includes mesh-like parts provided in the third pipe having planes substantially perpendicular to the third direction. Hereinafter, description of contents overlapping with those of the second embodiment will be partially omitted.

Figure 13:
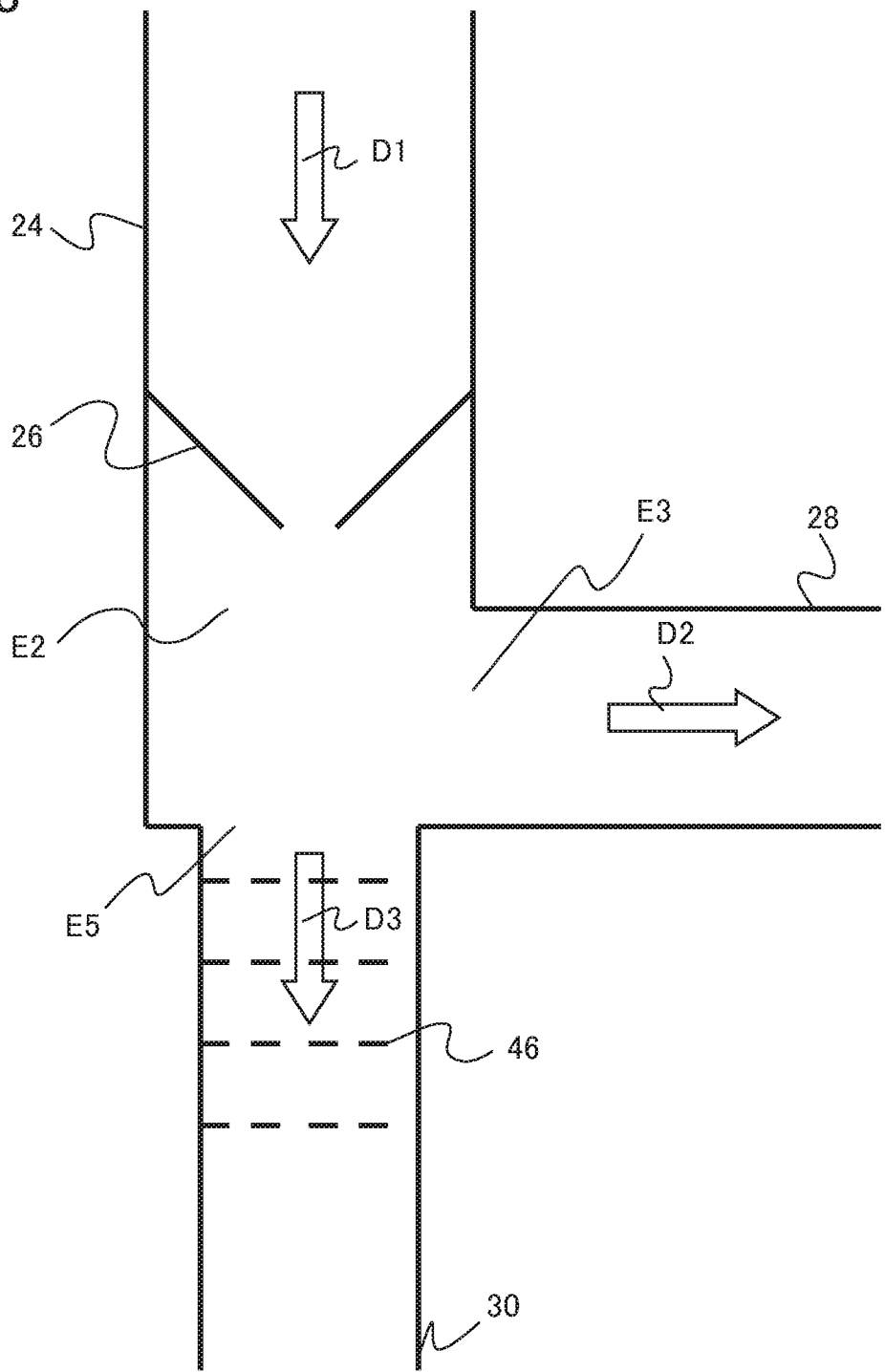
FIG. 13 is a schematic diagram of an example of a film forming apparatus according to a sixth embodiment.

FIG. 13 is a partially enlarged view of the film forming apparatus according to the sixth embodiment. FIG. 13 is a diagram corresponding to FIG. 8 showing the second embodiment.

In the film forming apparatus according to the sixth embodiment, a plurality of mesh-like parts 46 having planes substantially perpendicular to the third direction D3 are provided in the drain 30.

In the film forming apparatus according to the sixth embodiment, the mesh-like parts 46 are provided, so that an area of a droplet contact portion increases in the drain 30. Therefore, collection efficiency of the droplets is improved.

As described above, according to the sixth embodiment, the collection efficiency of the droplets of the reactive by-products contained in the exhaust gas is further improved as compared with the second embodiment. Therefore, it is possible to provide a film forming apparatus capable of suppressing clogging of an exhaust pipe or a failure of an exhaust pump.

Seventh Embodiment

A film forming apparatus according to a seventh embodiment is different from the film forming apparatus according to the second embodiment in that the film forming apparatus further including plate-like parts provided in the third pipe substantially parallel to the third direction. Hereinafter, description of contents overlapping with those of the second embodiment will be partially omitted.

Figure 14:
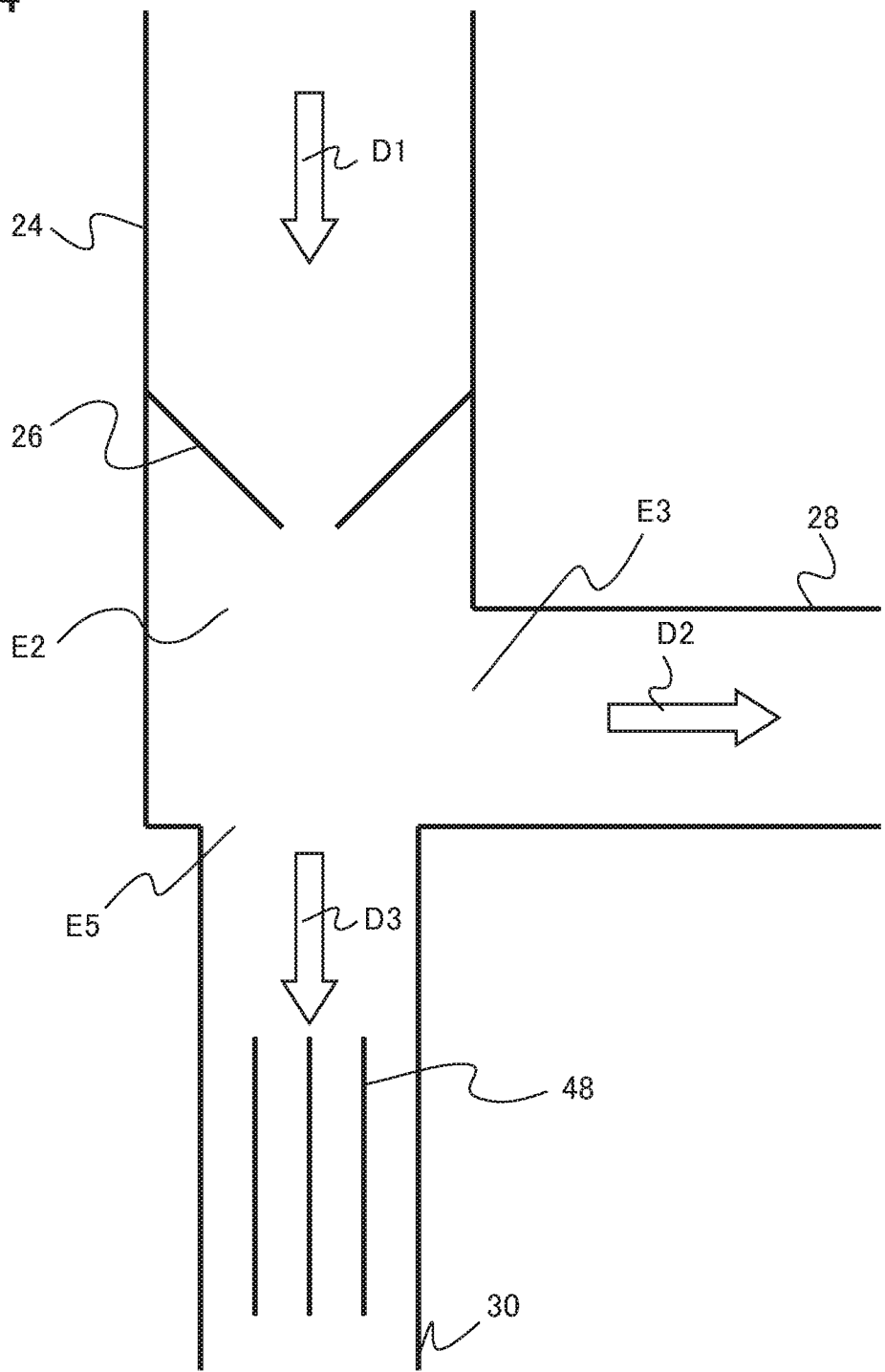
FIG. 14 is a schematic diagram of an example of a film forming apparatus according to a seventh embodiment.

FIG. 14 is a partially enlarged view of the film forming apparatus according to the seventh embodiment. FIG. 14 is a diagram corresponding to FIG. 9 showing the second embodiment.

In the film forming apparatus according to the seventh embodiment, a plurality of plate-like parts 48 substantially parallel to the third direction D3 are provided in the drain 30.

In the film forming apparatus according to the seventh embodiment, the plate-like parts 48 are provided, so that an area of a droplet contact portion increases in the drain 30. Therefore, collection efficiency of droplets is improved.

As described above, according to the seventh embodiment, the collection efficiency of the droplets of the reactive by-products contained in the exhaust gas is further improved as compared with the second embodiment. Therefore, it is possible to provide a film forming apparatus capable of suppressing clogging of an exhaust pipe or a failure of an exhaust pump.

Eighth Embodiment

A film forming apparatus according to an eighth embodiment is different from the film forming apparatus according to the second embodiment in that a tip of a narrow portion is located in a third pipe. Hereinafter, description of contents overlapping with those of the second embodiment will be partially omitted.

Figure 15:
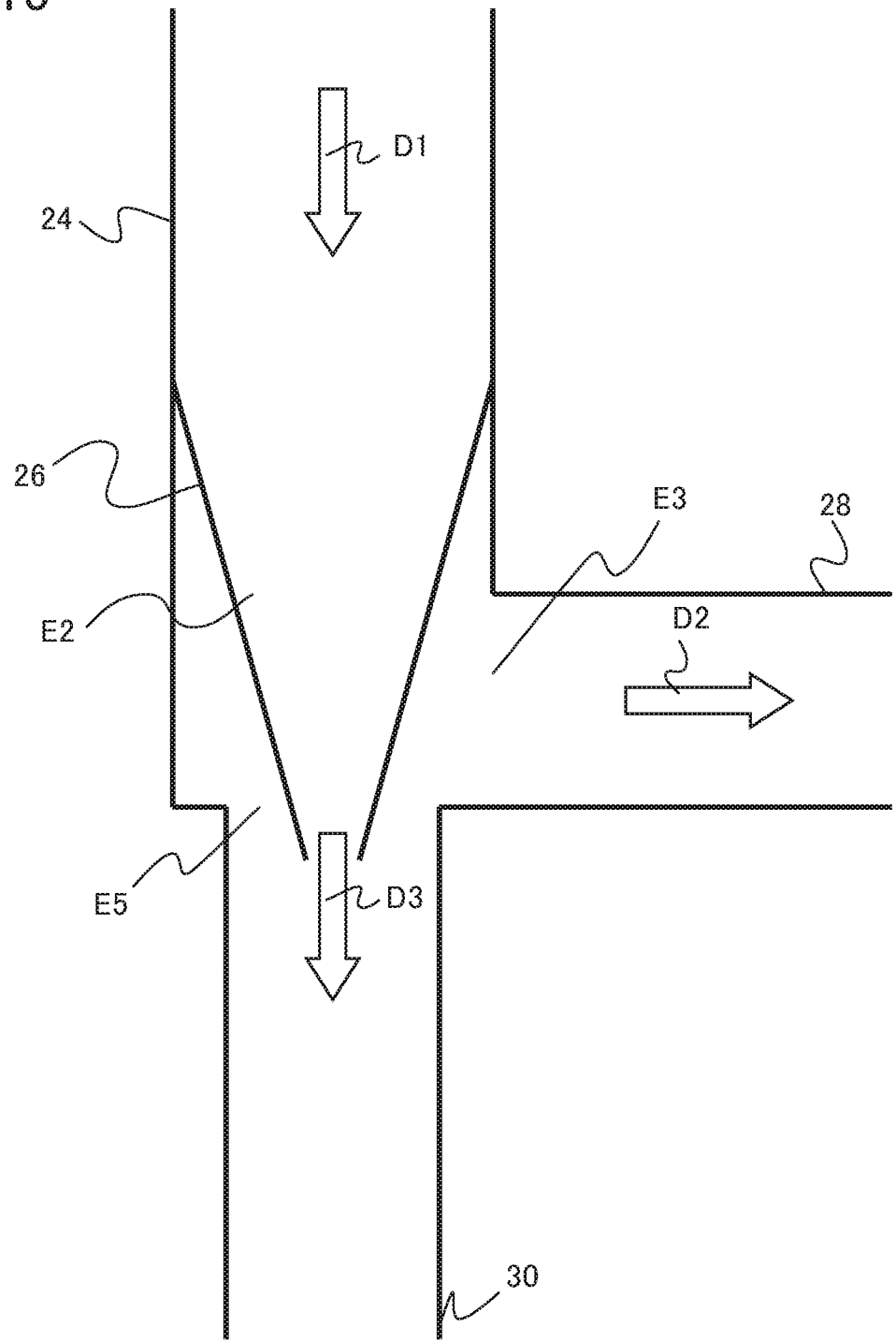
FIG. 15 is a schematic diagram of an example of a film forming apparatus according to an eighth embodiment.

FIG. 15 is a partially enlarged view of the film forming apparatus according to the eighth embodiment. FIG. 15 is a diagram corresponding to FIG. 9 showing the second embodiment.

In the film forming apparatus according to the eighth embodiment, a tip of an orifice 26 is located in a drain 30.

In the film forming apparatus according to the eighth embodiment, the tip of the orifice 26 is located in the drain 30, so that introduction efficiency of exhaust gas into the drain 30 is improved. Therefore, collection efficiency of droplets is improved.

As described above, according to the eighth embodiment, the collection efficiency of the droplets of the reactive by-products contained in the exhaust gas is further improved as compared with the second embodiment. Therefore, it is possible to provide a film forming apparatus capable of suppressing clogging of an exhaust pipe or a failure of an exhaust pump.

Ninth Embodiment

A film forming apparatus according to a ninth embodiment is different from the film forming apparatus according to the second embodiment in that a narrow portion has a tubular shape. Hereinafter, description of contents overlapping with those of the second embodiment will be partially omitted.

Figure 16:
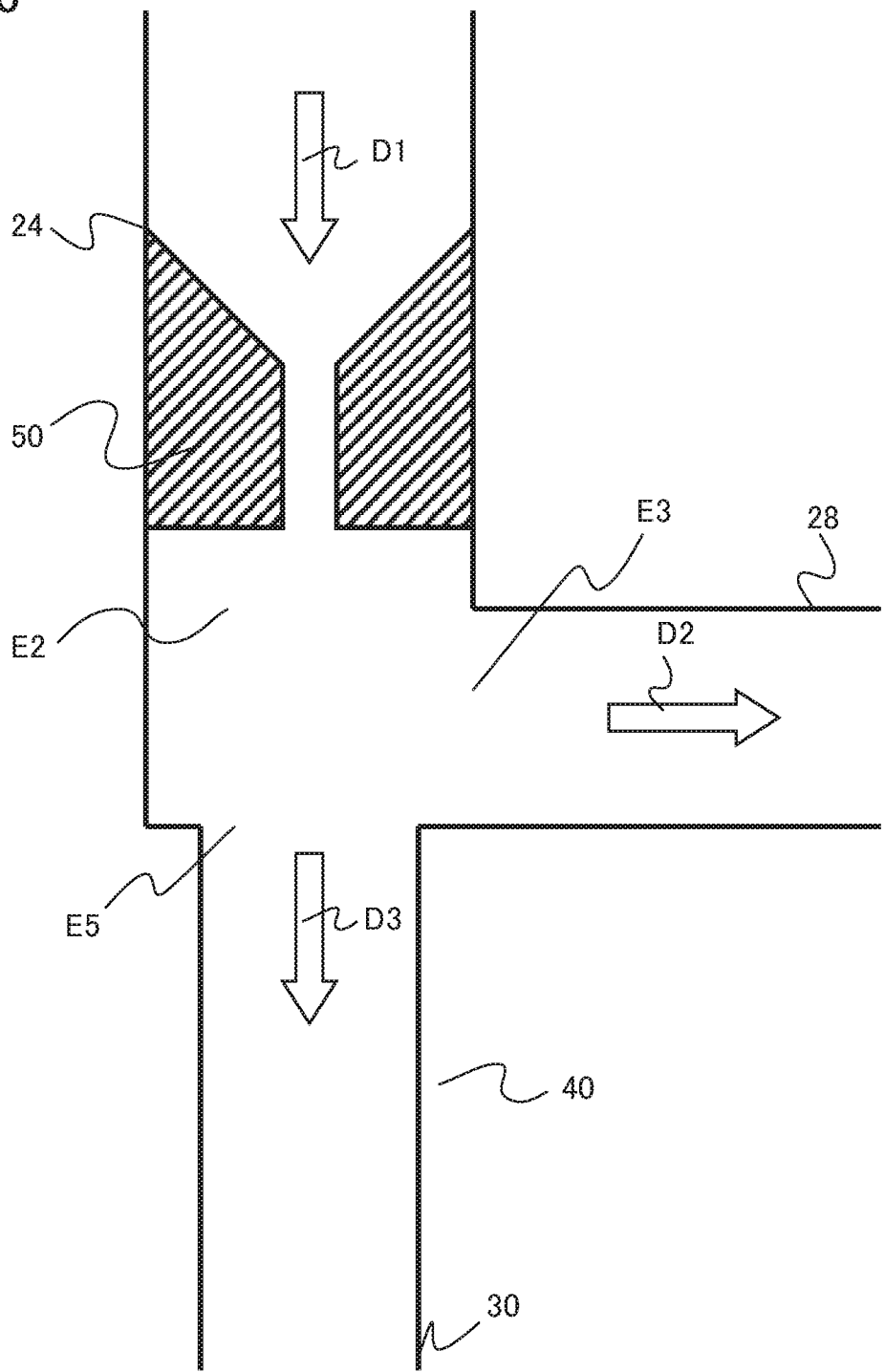
FIG. 16 is a schematic diagram of an example of a film forming apparatus according to a ninth embodiment.

FIG. 16 is a partially enlarged view of the film forming apparatus according to the ninth embodiment. FIG. 16 is a diagram corresponding to FIG. 9 showing the second embodiment.

The film forming apparatus according to the ninth embodiment has a pipe 50. The pipe 50 is an example of the narrow portion. The pipe 50 has a tubular shape.

As described above, according to the ninth embodiment, collection efficiency of droplets of reactive by-products contained in exhaust gas is improved, similarly to the second embodiment. Therefore, it is possible to provide a film forming apparatus capable of suppressing clogging of an exhaust pipe or a failure of an exhaust pump.

Tenth Embodiment

A film forming apparatus according to a tenth embodiment is different from the film forming apparatus according to the second embodiment in that a part of a third pipe is inclined with respect to a first direction. Hereinafter, description of contents overlapping with those of the second embodiment will be partially omitted.

Figure 17:
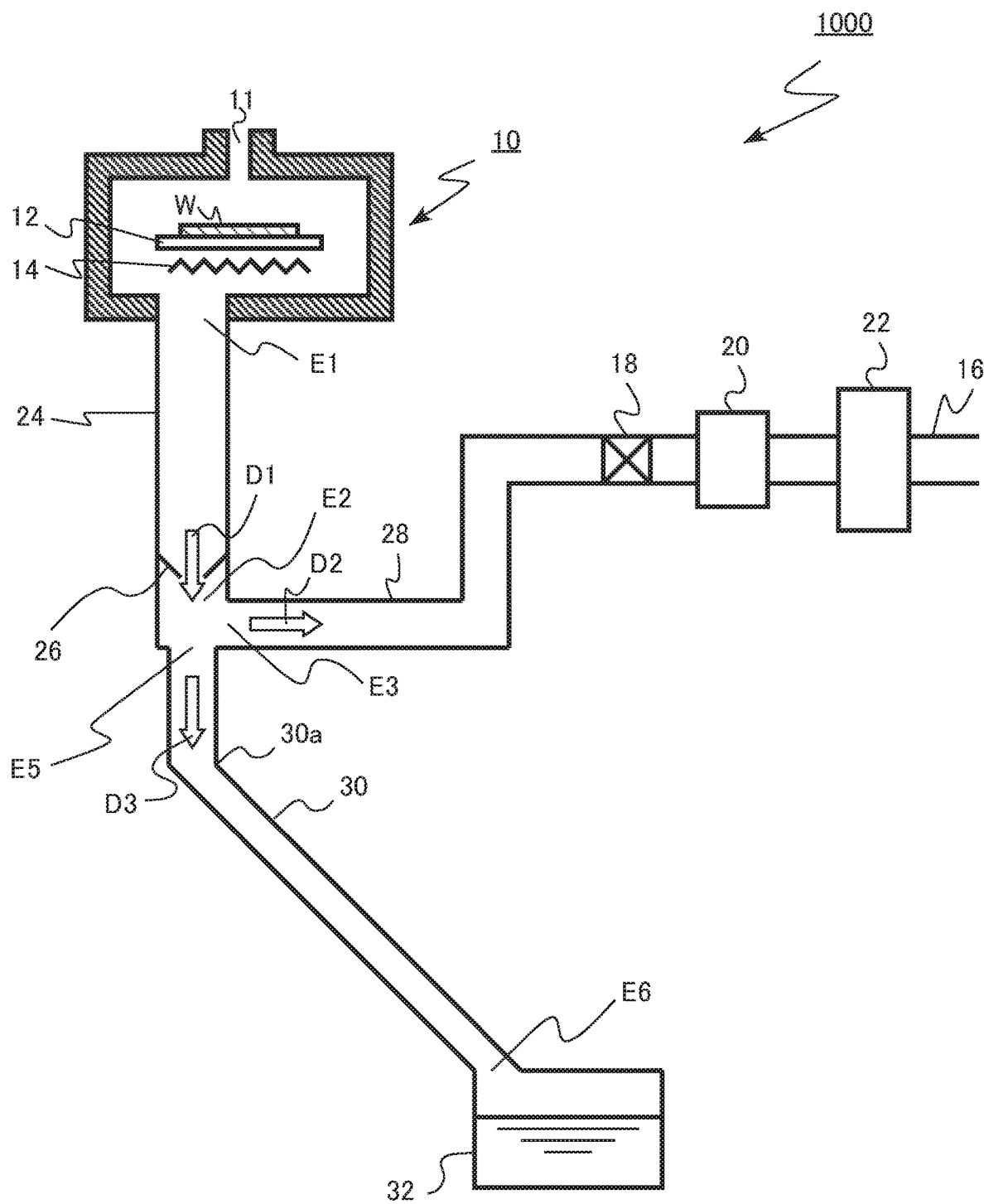
FIG. 17 is a schematic diagram of an example of a film forming apparatus according to a tenth embodiment.

FIG. 17 is a schematic diagram of an example of the film forming apparatus according to the tenth embodiment. The film forming apparatus according to the example of the tenth embodiment is a film forming apparatus 1000 for manufacturing a semiconductor device. The film forming apparatus 1000 according to the tenth embodiment is a single-wafer type film forming apparatus 1000 for an epitaxial film formation.

In the film forming apparatus according to the tenth embodiment, a part of a drain 30 is inclined with respect to a first direction D1. A bent portion 30a is provided in the middle of the drain 30.

In the film forming apparatus according to the tenth embodiment, the part of the drain 30 is inclined with respect to the first direction D1, so that a swirling flow is likely to occur in the drain 30. For this reason, exhaust gas is likely to be drawn into the drain 30 by the swirling flow occurring in the drain 30. As a result, collection efficiency of droplets is suppressed from being lowered by backflow of the exhaust gas.

By the swirling flow in the drain 30, the droplets in the exhaust, gas are likely to be centrifugally separated and to adhere to an inner wall of the drain 30. Therefore, collection efficiency of droplets is improved.

As described above, according to the tenth embodiment, the collection efficiency of the droplets of the reactive by-products contained in the exhaust gas is further improved as compared with the second embodiment. Therefore, it is possible to provide a film forming apparatus capable of suppressing clogging of an exhaust pipe or a failure of an exhaust pump.

In the first to tenth embodiments, the film forming apparatus for manufacturing the semiconductor device has been described as an example. However, the present disclosure can also be applied to a film forming apparatus for manufacturing a liquid crystal device, for example.

While certain embodiments have been described, these embodiments have been presented by way of example only, and are not intended to limit the scope of the inventions. Indeed, the film forming apparatus described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A film forming apparatus comprising:
   a reaction chamber;
   a pump decompressing an inner portion of the reaction chamber;
   a storage container storing a discharged liquid;
   a first pipe having first end portion and second end portion, the first end portion being connected to the reaction chamber, the first pipe extending in a first direction in a vicinity of the second end portion, and the first pipe having a first opening area in cross-section perpendicular to the first direction;
   a second pipe provided between the first pipe and the pump, the second pipe having third end portion and fourth end portion, the second pipe extending in a second direction different from the first direction in a vicinity of the third end portion, the fourth end portion being connected to the pump; and
   a third pipe provided between the first pipe and the storage container, the third pipe having fifth end portion and sixth end portion, the third pipe extending in a third direction different from the second direction in a vicinity of the fifth end portion, the fifth end portion being located on an imaginary straight line extending in the first direction from a center of the second end portion and the sixth end portion being connected to the storage container,
   wherein the first pipe branches into the second pipe and the third pipe, the third end portion is connected to the second end portion, and fifth end portion is connected to the second end portion.

2. The film forming apparatus according to claim 1, further comprising: a narrow portion provided in the first pipe, the narrow portion having a second opening area smaller than the first opening area in cross-section perpendicular to the first direction.

3. The film forming apparatus according to claim 2, wherein a third opening area of the fifth end portion is larger than the second opening area.

4. The film forming apparatus according to claim 1, wherein at least a part of the third pipe is inclined with respect to the first direction.

5. The film forming apparatus according to claim 1, wherein the third direction is different from the first direction.

6. The film forming apparatus according to claim 1, wherein the third pipe is installed such that the liquid by-product flows through the third pipe by gravity and is stored in the storage container.

7. The film forming apparatus according to claim 1, further comprising: a cooling portion cooling the third pipe.

8. The film forming apparatus according to claim 1, further comprising: a spiral-shaped part provided in the third pipe, the spiral-shaped part extending in the third direction.

9. The film forming apparatus according to claim 1, further comprising: a funnel-shaped part provided in the third pipe.

10. The film forming apparatus according to claim 1, further comprising: a mesh-like part provided in the third pipe, the mesh-like part having a plane substantially perpendicular to the third direction.

11. The film forming apparatus according to claim 1, further comprising: a plate-like part provided in the third pipe, the plate-like part substantially parallel to the third direction.

12. The film forming apparatus according to claim 1, wherein a length of the third pipe is 0.2 m or more.

* * * * *